United States Patent [19]
Palmer

[11] Patent Number: 5,128,616
[45] Date of Patent: Jul. 7, 1992

[54] DC VOLTAGE TESTER HAVING PARALLEL CONNECTED RESISTIVE ELEMENTS IN THERMAL CONTACT WITH A THERMOCHRONIC MATERIAL

[75] Inventor: Alan Palmer, Los Gatos, Calif.

[73] Assignee: Duracell Inc., Bethel, Conn.

[21] Appl. No.: 652,165

[22] Filed: Feb. 7, 1991

[51] Int. Cl.$^5$ ............................................. G01N 27/416
[52] U.S. Cl. ................................... 324/435; 324/437; 324/106; 359/44; 359/288
[58] Field of Search ................................ 324/104–106, 324/435, 437, 96, 122; 350/351, 331 R, 331 T, 341, 334, 359; 340/786, 851; 374/162, 161

[56] References Cited
U.S. PATENT DOCUMENTS

| | | | |
|---|---|---|---|
| 3,141,107 | 7/1964 | Wasserman | 324/122 |
| 3,296,530 | 1/1967 | Brooks | 324/122 |
| 4,617,562 | 10/1986 | Klotz | 324/96 X |
| 4,702,564 | 10/1987 | Parker | 324/104 X |

*Primary Examiner*—Jack B. Harvey
*Attorney, Agent, or Firm*—Ronald S. Cornell; James B. McVeigh, Jr.

[57] ABSTRACT

A DC voltage tester having a plurality of resistive elements in thermal contact with a thermochromic material wherein the resistive elements are connected in a parallel configuration.

20 Claims, 1 Drawing Sheet

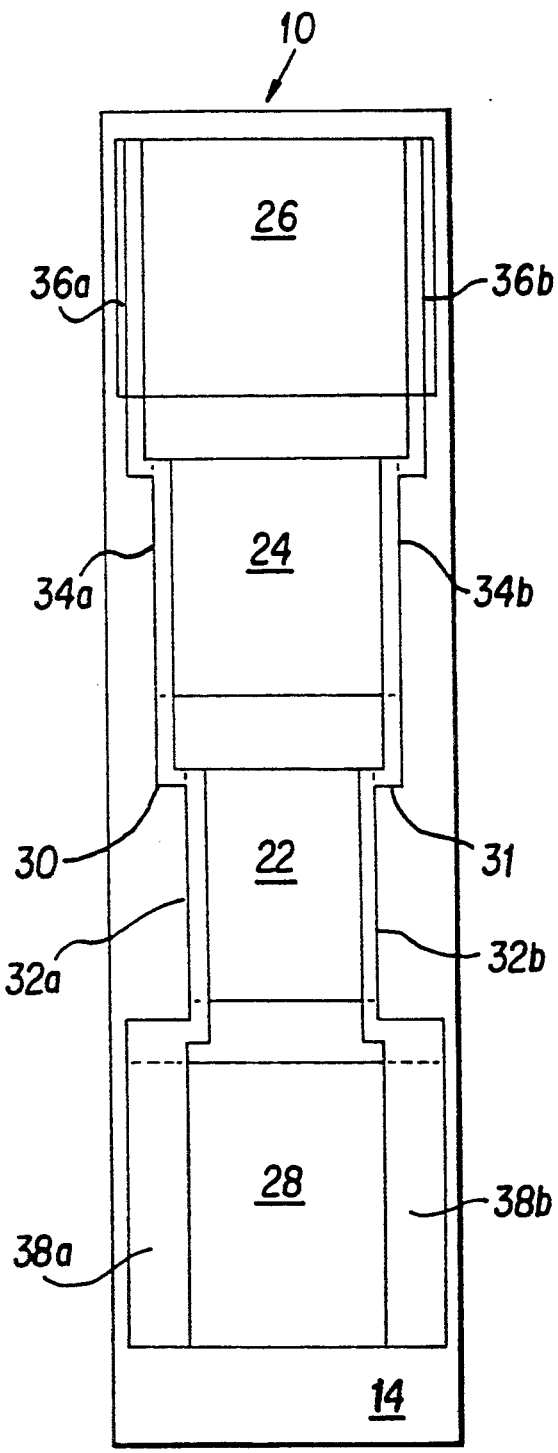
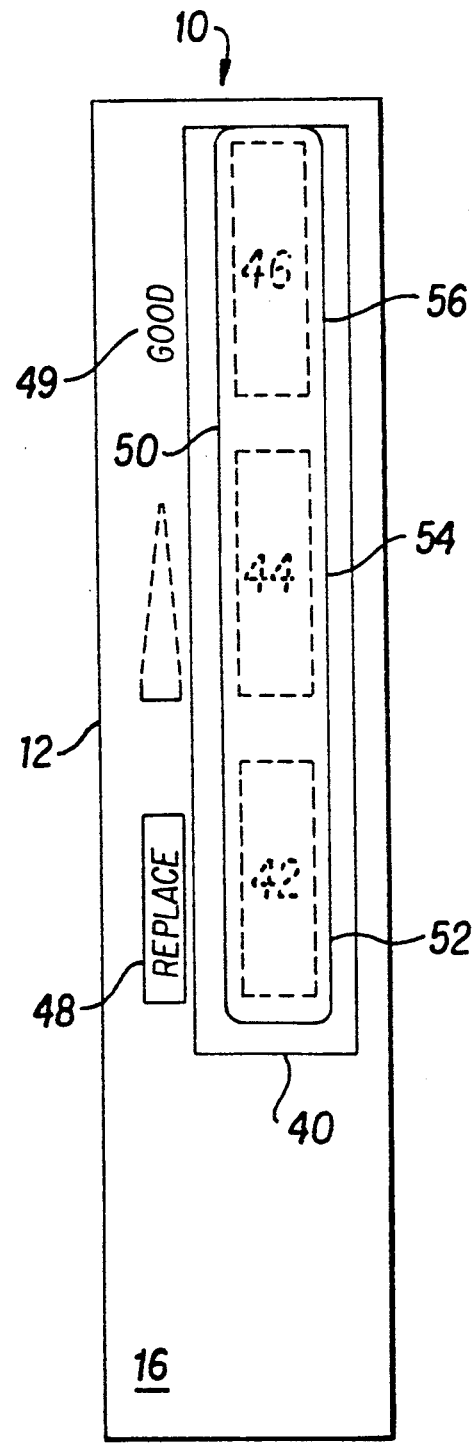
FIG. 1
FIG. 2

DC VOLTAGE TESTER HAVING PARALLEL CONNECTED RESISTIVE ELEMENTS IN THERMAL CONTACT WITH A THERMOCHRONIC MATERIAL

The present invention relates to a battery tester comprising a plurality of resistive elements in thermal contact with a thermochromic material. In particular, the present invention relates to a battery tester for a 9V battery wherein the plurality of resistive elements are electrically connected in a parallel configuration.

Over the past several years a variety of battery testers employing a resistive element in thermal contact with a thermochromic material have become available. The majority of these testers have used a single resistive element which has a continuously varying resistance between one portion of the element and another portion. For example, U.S. Pat. Nos. 4,835,476, 4,726,661, 4,835,475, 4,702,563, 4,702,564, 4,737,020, and 4,006,414 all disclose a "bow-tie" shaped resistive element. This embodiment has its highest resistance at the narrow portion and the resistance continuously decreases to its lowest value at the outer portions. Another embodiment disclosed in many of these references is a single "wedge" shaped resistive element which is essentially half of the "bow-tie" shaped element. A thermochromic material is generally applied to the opposite side of a substrate which bears the resistive element. When the terminals of a battery are connected to contacts located at opposite ends of the resistive element a current flows therethrough that is proportional to the voltage of the battery. Resistive heating causes the narrow portion of the resistive element to heat up first. The thermochromic material changes color in response to the heat generated. Generally, a specific threshold temperature must be reached before the color change occurs. The extent to which heating continues down the length of the resistive element is a function of the battery voltage. Observation of the color change against a scale imprinted on the tester gives a visual indication of the battery voltage.

As discussed above, presently available battery testers use a "wedge" shaped resistor. While this configuration is adequate for 1.5V batteries it has been discovered that it is not adequate for repeated testing of higher voltage batteries such as 9V batteries. It has been found that the narrow portion of a wedge shaped element "burns out" after repeated testing of a 9V battery due to the higher power which is dissipated in this portion vis-a-vis a 1.5V battery. Additionally, a wedge shaped element having a resistance of about 50 ohms (e.g. a typical resistance of a device powered by a 9V battery) would have a length which would make it difficult to use, particularly if the tester is associated with a battery package as disclosed in U.S. Pat. No. 4,723,656.

It is an object of the present invention to provide an improved battery tester for batteries having an open circuit voltage greater than 1.5V wherein the tester can withstand the higher power dissipated by these batteries.

It is an additional object of the present invention to provide a battery tester for batteries having a voltage in excess of 1.5V which is of a convenient size.

The features and advantages of the present invention are explained below in reference to the Figures in which:

FIG. 1 shows a backside view of a tester made in accordance with the present invention; and FIG. 2 shows a frontside view of a tester made in accordance with the present invention.

Referring now to FIGS. 1 and 2, tester 10 comprises a plurality of rectangular resistive elements 22, 24, 26, and 28 located on the back side 14 of substrate 12. Buss bars 30 and 31 run along opposite edges of the resistive element pattern whereby elements 22, 24, 26, and 28 are electrically connected in a parallel configuration. Portions 38a and 38b of buss bars 30 and 31, respectively, function as the electrical contact pads for connection to the terminals of a 9V battery.

Substrate 12 can be made from a variety of materials including, but not limited to, plastic, paper, cardboard, and the like. Whichever material is selected it should be able to withstand the temperature of the resistive elements during the voltage measurement without shrinking, deforming, charring, etc.

Resistive elements 22, 24, 26, and 28 can be made from a variety of resistive materials and can be applied by a variety of different methods. For example, a coating of an electrically resistive ink can be coated or printed on the substrate in the desired pattern. Suitable resistive materials include, but are not limited to, epoxy or urethane based silver, nickel, carbon, or mixtures thereof. Alternatively, a thin resistive layer can be applied in the desired pattern using any of the well known vacuum deposition techniques such as vacuum vapor deposition, cathode sputtering, and the like. Suitable materials amenable to vacuum deposition include, but are not limited to, silver, nickel, iron, copper, carbon, lead, and mixtures thereof. The particular choice of material depends on the resistivity needed to achieve the desired resistance for a particular size of resistor. Generally, the size of the resistive elements is limited by the dimensions of the tester as well as the watt density needed to obtain a response from the thermochromic material (discussed more fully below).

Buss bars 30 and 31 are shaped to follow the outside dimensions of the pattern of resistive elements. The resistance of each of elements 22, 24, 26, and 28 depends, in part, on the distance between the opposed inside edges of each buss bar. Thus, for example, the resistance of element 22 is a function of the distance between the inside edge of portion 32a of buss bar 30 and the inside edge of portion 32b of buss bar 31. Buss bars 30 and 31 are preferably highly conductive so that they do not contribute measurably to the overall resistance of the tester. Any well known conductive ink can be used for the buss bars. Examples include, but are not limited to metallic inks comprised of silver, copper, nickel, and the like. Additionally, metal foil can be used if it is cut to the shape shown in the Figures and attached to the resistive elements using any of the methods of attachment well known to the artisan.

It is preferred that a dielectric coating (not shown) is applied over the resistive elements and the buss bars with the exception of contact pads 38a and 38b. The purpose of the dielectric layer is to protect the circuit from physical damage as well as from inadvertent short-circuiting of any portion of the circuit. Any well known dielectric ink, paint, film, or the like is suitable for this purpose. Examples include, but are not limited to, epoxies, acrylics, and urethanes.

Imprinted on front side 16 of substrate 12 is voltage indication scale 40 which is rectangularly shaped and comprises windows 42, 44, and 46. Windows 42, 44, and 46 are coincident with the position of resistive elements 22, 24, and 26, respectively, on the opposite side of substrate 12. Voltage indication scale 40 can be printed, for example, in a dark color and each window can be printed in a bright contrasting color, such as yellow.

A thermochromic layer 50 is located over all three windows. Preferably, layer 50 comprises a thermochromic ink which turns from opaque to clear above a certain threshold temperature, $T_r$. The ink preferably has a color at room temperature which is similar to the color of scale 40 and changes to clear at a temperature above $T_r$. Thus, windows 42, 44, and 46 are blocked from view at room temperature but become visible during testing depending on the voltage of the battery. Generally, a particular watt density must be reached in each resistive element during testing before the temperature of the element reaches $T_r$. The watt density is a function of the resistance of the resistive element, the surface area of the element and the voltage applied across the element. The resistance and surface area of each element become fixed for a given design so that the applied voltage becomes the sole determinant of whether the watt density is achieved that is needed to trigger the thermochromic ink.

While thermochromic inks are the preferred thermochromic materials, an alternative, less preferred thermochromic material includes the class of materials known as liquid crystals.

Graphics 48 and 49 are printed alongside scale 40 to indicate "Replace" and "Good" or any equivalent message concerning the condition of the battery being tested.

As described, resistive element 28 is not in thermal contact with the thermochromic layer. The purpose of resistive element 28 is to act as a shunt and lower the total resistance of the parallel connected resistive elements. Resistive element 28 is not a necessary component of the present invention, however it is desirable to include it when the total resistance of the other "voltage indicating" resistors is higher than desired. For example, the resistance of a typical device powered by a 9V battery is between about 50 and 60 ohms so that this is the desired resistance range for a 9V battery tester. If the resistances of elements 22, 24, and 26, connected in parallel, give a total resistance of less than about 60 ohms then element 28 is not needed. However, if the total resistance of elements 22, 24, and 26 is greater than about 60 ohms then element 28 is included to lower the total resistance of the circuit. The desired resistance of elements 28 is determined using Ohm's Law and the resistance values of elements 22, 24, and 26. This is discussed more fully below in connection with the description of a specific embodiment.

The principle of operation of tester 10 is as follows. The terminals of a "fresh" 9V battery are brought into contact with pads 38a and 38b. Current flows through buss bars 30 and 31 as well as through resistive elements 22, 24, 26, and 28. Element 22 heats up fastest because it has the smallest size whereby it is first to reach the necessary watt density to trigger the thermochromic ink. As viewed from the front of the tester, portion 52 of thermochromic layer 50 turns from opaque to clear revealing colored window 42. In sequential fashion, resistive elements 24 and 26 achieve the threshold watt density to trigger the thermochromic ink whereby window 44 followed by window 46 are revealed (element 28 also heats up but since its function is not for voltage indication per se it is not discussed here). Each resistive element will reach an equilibrium temperature where the heat generated by $i^2R$ heating is equal to the heat lost to the surroundings. When the equilibrium temperature of a resistive element is above $T_r$ the ink which is coincident with such resistive element will turn from opaque to clear revealing the colored window beneath. Thus, for example, a "fresh battery" will cause elements 22, 24, and 26 to heat sufficiently so that portions 52, 54, and 56 of thermochromic layer 50 will turn clear revealing colored windows 42, 44, 46. On the other hand, if the battery is near its end-of-life only element 22 will heat sufficiently to reach the response temperature of the ink and only window 42 will be revealed. At some intermediate condition of the battery only windows 42 and 44 will be revealed telling the user that the battery will soon have to be replaced.

The ordering of resistive elements 22, 24, 26 and 28 on substrate is designed to provide a particular visual effect during testing. As described above, element 22 heats up fastest during testing followed by elements 24 and 26. This causes a sequential visual effect in the thermochromic material on the front of the tester. However, other orderings of parallel connected resistive elements are possible for providing different visual effects. Further, while shunt resistor 28 is shown located immediately beneath contacts 38a and 38b it could be located at the opposite end of the resistor sequence, or anywhere else, provided a parallel connection of the resistive elements is maintained.

Immediately following is a specific description of a battery tester for a 9V battery. It is to be understood, however, that other designs are possible which are also within the scope of the present invention.

The "trigger" voltages for the three resistive elements are selected as follows. The voltage chosen to indicate that a 9V alkaline battery is "good" is about 8 volts or more since discharge at, or above, this voltage indicates that the battery has the majority of its capacity still available. Therefore, resistive element 26 is designed to trigger the thermochromic ink at, or above this voltage. The voltage chosen to indicate that the battery should be replaced is about 5 volts or less since discharge at, or below this voltage, indicates that the battery is almost completely discharged. Therefore, resistive element 22 is designed to trigger the thermochromic ink at about 5 volts. An intermediate voltage which indicates that a 9V battery has had a majority of its capacity removed is about 6.5 volts and this is the "trigger" value selected for resistive element 24. The voltages chosen will, of course, depend on how many resistive elements are used. Additional "intermediate" voltages would be selected if more than three resistive elements are used in the circuit.

The substrate is a piece of polyester film that is 0.005 inch thick, 0.7 inch wide, and 2 inches long. The resistive elements 22, 24, 26, and 28 each comprise a substantially uniform layer 0.0006 inch thick of an epoxy based carbon (Acheson Colloids Co., Port Huron Mich.) having a resistivity of 300 ohms/square at this thickness. Element 22 is 0.3 inch wide (the width being the dimension parallel to the short dimension of the substrate) and 0.45 inch long; element 24 is 0.4 inch wide and 0.45 inch long; element 26 is 0.55 inch wide and 0.4 inch long; and element 28 is 0.4 inch wide and 0.45 inch long. These dimensions ensure that the necessary watt density will be reached in each resistive element at the predetermined "trigger" voltages described above.

Buss bars 30 and 31 are printed on the surface and along the outer edges of the resistive elements using a silver ink (Acheson Colloids Co.) having a resistivity of 0.01 ohms/square at a thickness of 0.6 mils. Each buss bar is 0.6 mils thick and 0.06 inch wide except for contact pads 38a and 38b which are about 0.1 inch wide. The inner edges of buss bar portions 32a and 32b are 0.2 inch apart, 34a and 34b are 0.3 inch apart, 36a and 36b are 0.4 inch apart, and contact pads 38a and 38b are 0.35 inch apart.

As mentioned previously, the resistance of the resistive elements depends, in part, on the distance between the opposed inside edges of the buss bars attached to each resistive element. The resistance of element 22 is about 150 ohms, the resistance of element 24 is about 250 ohms, the resistance of element 26 is about 325 ohms, and the resistance of element 28 is about 250 ohms. According to Ohm's Law these resistors, connected in parallel, have a total resistance of about 55 ohms. The effect of including element 28 in the circuit is evident by calculating what the total resistance would be if only elements 22, 24, and 26 were connected in parallel. That calculation gives a value of about 70 ohms. Thus, including element 28 in the circuit lowers the overall resistance to a value which is closer to that of an actual device. It is possible that by choosing a different resistive material the resistance of elements 22, 24, and 26 could be changed so that shunt resistor 28 is not needed. However, this can be difficult to achieve exactly with three resistors. Greater flexibility is provided by using a shunt resistor to "fine tune" the total resistance after elements 22, 24, and 26 are designed.

The thermochromic ink used in this example is Type 47 made by Matsui International Co., Inc. which has a response temperature, $T_r$, of about 47° C. The watt density needed in each of the above described resistive elements to reach the response temperature of this ink is about 1.5 watts/in$^2$.

A dielectric layer of an acrylic (Acheson Colloids Co.) 0.0006 inch thick is applied over the resistive elements and buss bars with the exception of contact pads 38a and 38b.

The front surface 16 of substrate 12 is first printed over with a green background color. A bright yellow stripe is printed onto the green background and the voltage indication scale 40 comprising windows 42, 44, and 46 is printed in black over the yellow stripe such that yellow is only visible through said windows. As discussed above, windows 42, 44, and 46 are positioned so that they are coincident with resistive elements 22, 24, and 26. Graphics 48 and 49 are printed along scale 40.

The above described tester can be used as a free standing tester or it can be made an integral part of the package used for the display and sale of the batteries. Since the total current flowing through the tester during testing is split among four resistors the heating problem associated with a single wedge shaped element is avoided.

While the above described embodiment is preferred, there is another, although less preferred, embodiment which also uses parallel connected resistive elements. This embodiment employs resistive elements having the same predetermined resistance and a different thermochromic material in thermal contact with each resistive element. For example, assume elements 22, 24, and 26 all have the same resistance. Portion 52 of thermochromic layer 50 would comprise a thermochromic ink which would respond to the watt density resulting from applying 5 volts across the resistive elements. Portion 54 of thermochromic layer 50 would comprise a second different thermochromic ink which would respond to only a higher watt density resulting from applying 6.5 volts across the resistive elements. Portion 56 of thermochromic layer 50 would comprise a third different thermochromic ink which would respond to only a watt density resulting from applying 8 volts across the resistive elements. Thus, the same voltage indication would be observed as with using the preferred embodiment. A disadvantage to this less preferred embodiment is that two additional manufacturing steps would be required for applying the second and third thermochromic inks.

While the above described design relates to a tester for 9V batteries, the present invention can be used for testers designed for cylindrical 1.5V cells such as D, C, AA, and AAA sizes. Materials other than those described in the specific example can be used to fabricate testers within the scope of the present invention. The specific example is for illustrative purposes only and is not intended to limit the scope of the invention as claimed.

What is claimed is:

1. A DC voltage tester comprising a substrate; an electrical circuit located on one side of the substrate and comprising at least two resistive elements and a pair of electrical contacts, wherein the resistive elements and the pair of contacts are connected in a parallel configuration and thermochromic material in thermal contact with at least two of the resistive elements.

2. The voltage tester of claim 1 wherein the thermochromic material is a thermochromic ink.

3. The voltage tester of claim 1 comprising three resistive elements, each of said elements being in thermal contact with a thermochromic material.

4. The voltage tester of claim 1 wherein each resistive element is in thermal contact with an identical thermochromic material, and each element has a different predetermined resistance.

5. The voltage tester of claim 1 wherein at least two resistive elements have about the same predetermined resistance and each are in thermal contact with a different thermochromic material.

6. The voltage tester of claim 1 wherein there are three resistive elements, each in thermal contact with a thermochromic material, and further comprising a fourth resistive element not in thermal contact with a thermochromic material.

7. The voltage tester of claim 1 adapted to test a 9V battery wherein said thermochromic material has a response temperature, $T_r$, which is above room temperature and said circuit comprises first, second, and third resistive elements wherein, when a voltage of about 5 volts or less is applied to the electrical contacts only said first element will heat up to a temperature greater than or equal to $T_r$; when a voltage of between about 5 volts and 8 volts is applied to the electrical contacts only said first and second elements will heat up to a temperature greater than or equal to $T_r$; and when a voltage of about 8 volts or more is applied to the electrical contacts said first, second, and third elements will heat up to a temperature greater than or equal to $T_r$.

8. The voltage tester of claim 1 wherein each resistive element is a rectangularly shaped deposit of a resistive material and said elements are aligned in a row parallel to the length dimension a rectangularly shaped substrate, and said electrical circuit has a total resistance of between about 50 and 70 ohms.

9. The voltage tester of claim 1 further comprising a pair of electrically conductive buss bars, wherein one buss bar is connected along one edge of each resistive element and the other buss bar is connected along an opposite edge of each resistive element and wherein an end portion of each buss bar functions as an electrical contact.

10. A battery tester comprising a substrate; an electrical circuit located on one side of the substrate and comprising at least three resistive elements, a pair of electrical contacts so positioned as to be capable of alignment with the terminals of a battery, and electrical connection means for connecting the resistive elements and the pair of contacts in a parallel configuration; a voltage scale located on the other side of the substrate in a position coincident with the position of the resistive elements; and thermochromic material on the same side of the substrate as the voltage scale and being in thermal contact with at least three of the resistive elements.

11. The battery tester of claim 10 wherein each resistive element is rectangularly shaped deposit of a resistive material and said elements are arranged in a row parallel to the lengthwise dimension of the substrate.

12. The battery tester of claim 11 wherein a first resistive element has a predetermined resistance less than the predetermined resistance of a second element, and the second element has a predetermined resistance less than the predetermined resistance of a third element, and said second element being located in the row between said first and third elements.

13. The battery tester of claim 12 wherein said voltage scale means is a rectangularly shaped pattern having three windows, wherein one window is centered over each of said resistive elements.

14. The battery tester of claim 13 wherein said thermochromic material is a thermochromic ink having a response temperature, $T_r$, which is above room temperature, whereby said ink is opaque below $T_r$ and turns clear above $T_r$, and said ink is applied in a layer over each of said windows of said voltage scale.

15. The battery tester of claim 13 wherein a first of said windows is revealed when a voltage of about 5 volts or less is applied to said electrical contacts, said first window and a second window are revealed when a voltage of between about 5 volts and 8 volts is applied to said electrical contacts, and wherein all three windows are revealed when a voltage of greater than about 8 volts or more is applied to the electrical contacts.

16. The battery tester of claim 11 wherein there are first, second, third, and fourth resistive elements; said first, second, and third elements being in thermal contact with thermochromic material and said fourth element not being in thermal contact with a thermochromic material.

17. The battery tester of claim 16 wherein said electrical connection means comprises a pair of metallic buss bars, wherein one buss bar traverses the row of resistive elements and is connected to each resistive element along an outermost edge thereof, and the other buss bar traverses the row of resistive elements and is connected to each resistive element along the opposite outermost edge thereof.

18. The battery tester of claim 17 wherein the portion of each buss bar associated with the fourth resistive element functions as an electrical contact pad.

19. The battery tester of claim 18 wherein said elements are arranged in the row with said first element between said fourth and second elements and with said second element between said first and third elements, and wherein said first element has a predetermined resistance less than the predetermined resistance of said second element and said second element has a predetermined resistance less than the predetermined resistance of said third element whereby the total resistance of said first, second, and third elements connected in parallel is greater than about 60 ohms; and wherein said fourth resistive element has a predetermined resistance sufficient to lower the total resistance of all four elements connected in parallel to a value of less than about 60 ohms.

20. The battery tester of claim 19 wherein said the resistive material is selected from the group consisting of epoxy or urethane based carbon, silver, nickel, and mixtures thereof.

* * * * *